United States Patent
Tohara et al.

(10) Patent No.: US 11,756,769 B2
(45) Date of Patent: Sep. 12, 2023

(54) PLASMA PROCESSING APPARATUS

(71) Applicant: TOKYO ELECTRON LIMITED, Tokyo (JP)

(72) Inventors: Takashi Tohara, Austin, TX (US); Naokazu Furuya, Miyagi (JP); Yosuke Tamuro, Miyagi (JP); Yuzuru Sakai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 78 days.

(21) Appl. No.: 17/220,982

(22) Filed: Apr. 2, 2021

(65) Prior Publication Data

US 2021/0313151 A1 Oct. 7, 2021

(30) Foreign Application Priority Data

Apr. 3, 2020 (JP) .................................. 2020-067287

(51) Int. Cl.
*H01J 37/32* (2006.01)

(52) U.S. Cl.
CPC .. *H01J 37/32183* (2013.01); *H01J 37/32633* (2013.01); *H01J 37/32651* (2013.01); *H01J 37/32715* (2013.01)

(58) Field of Classification Search
CPC ........... H01J 37/32091; H01J 37/32183; H01J 37/32633; H01J 37/32651; H01J 37/32715; H01J 37/32889
See application file for complete search history.

(56) References Cited

U.S. PATENT DOCUMENTS

| | | | |
|---|---|---|---|
| 11,443,921 B2* | 9/2022 | Fu | H01J 37/32174 |
| 2006/0005856 A1* | 1/2006 | Sun | H01J 37/32357 |
| | | | 134/1.1 |
| 2006/0060302 A1* | 3/2006 | White | H01J 37/32174 |
| | | | 118/723 R |
| 2009/0260976 A1* | 10/2009 | Nakamura | C23C 14/067 |
| | | | 204/192.15 |
| 2011/0294303 A1* | 12/2011 | Sankarakrishnan | |
| | | | H01J 37/32568 |
| | | | 438/758 |
| 2018/0261436 A1* | 9/2018 | Nguyen | H01J 37/32899 |
| 2019/0221450 A1* | 7/2019 | Negoro | H01L 21/67017 |
| 2021/0296101 A1* | 9/2021 | Prouty | H01L 21/6831 |
| 2021/0296102 A1* | 9/2021 | Nagase | H01L 21/67393 |

FOREIGN PATENT DOCUMENTS

JP 2019-102680 A 6/2019

* cited by examiner

*Primary Examiner* — Tung X Le
(74) *Attorney, Agent, or Firm* — WEIHROUCH IP

(57) ABSTRACT

A plasma processing apparatus includes: a chamber accommodating a plurality of substrates; a plurality of substrate supports provided inside the chamber and configured to support a substrate; a plurality of radio-frequency power sources provided corresponding to the plurality of substrate supports, and configured to supply radio-frequency power to the plurality of substrate supports, respectively; and a plurality of shields configured to compart the inside of the chamber and provided corresponding to the plurality of substrate supports to define a processing space where plasma is generated. A radio-frequency current path is formed between the plurality of shields so as not to interfere with one another.

16 Claims, 9 Drawing Sheets

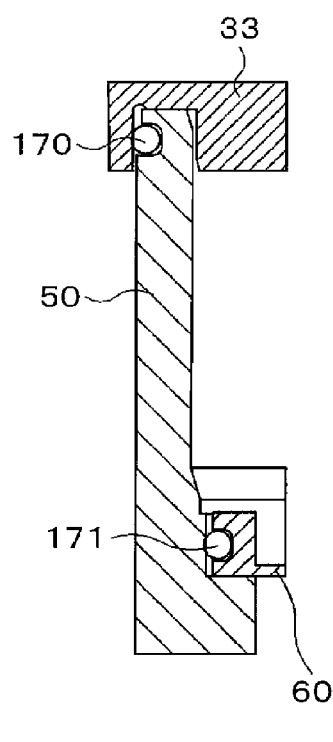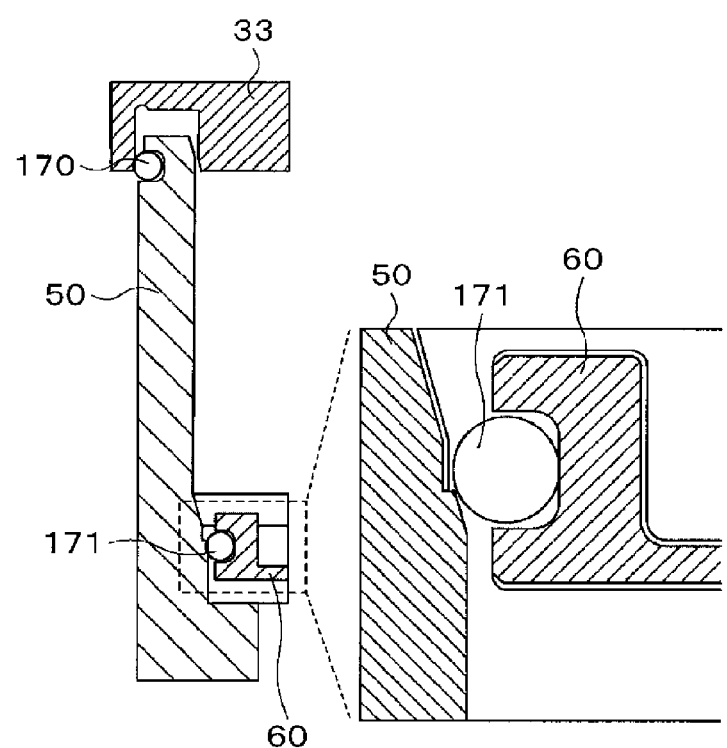
FIG. 6A  FIG. 6B

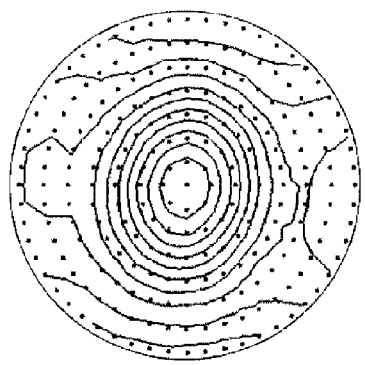
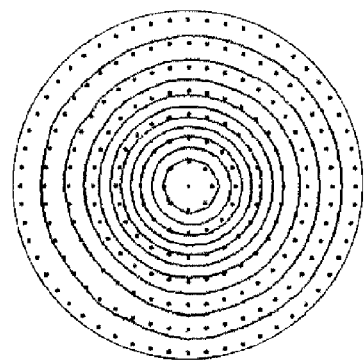
FIG. 9A
S1  S2
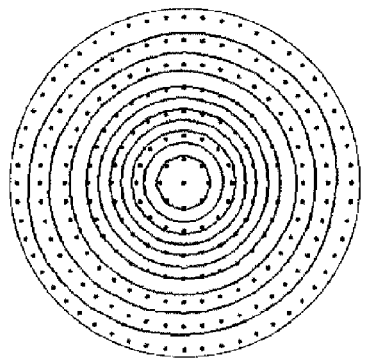
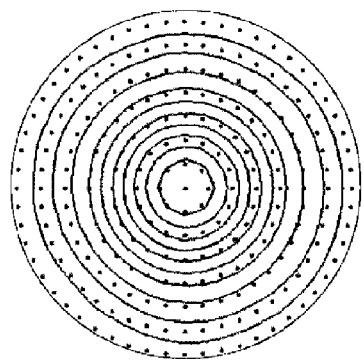
FIG. 9B
S1  S2

PLASMA PROCESSING APPARATUS

CROSS-REFERENCE TO RELATED APPLICATIONS

This application is based on and claims priority from Japanese Patent Application No. 2020-067287 filed on Apr. 3, 2020 with the Japan Patent Office, the disclosure of which is incorporated herein in its entirety by reference.

TECHNICAL FIELD

The present disclosure relates to a plasma processing apparatus.

BACKGROUND

Japanese Patent Laid-Open Publication No. 2019-102680 discloses a batch type processing apparatus capable of simultaneously processing a plurality of wafers. The processing apparatus includes a processing container that performs a processing on the wafer in a processing space having vacuum atmosphere. The processing container includes a wall that separates the processing space for processing the wafer into a plurality of processing chambers. A plurality of carry-in/out ports for the wafer is formed corresponding to the plurality of processing chambers in the wall of the processing container, and the processing apparatus includes a plurality of shield members provided along the wall surface of the processing container corresponding to the carry-in/out ports of the plurality of processing chambers.

SUMMARY

An aspect of the present disclosure is a plasma processing apparatus including: a chamber configured to accommodate a plurality of substrates; a plurality of substrate supports provided inside the chamber and each configured to support a substrate; a plurality of radio-frequency power sources provided corresponding to the plurality of substrate supports, and configured to supplying radio-frequency power to the plurality of substrate supports, respectively; and a plurality of shields configured to compart the inside of the chamber and provided corresponding to the plurality of substrate supports to define a processing space where plasma is generated. A radio-frequency current path is formed between the plurality of shields so as not to interfere with one another.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 6A and 6B are explanatory views illustrating a sealing state of a deposit shield in the related art.

FIGS. 9A and 9B are explanatory views illustrating experimental results of an etching rate distribution on a wafer.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In a process of manufacturing a semiconductor device, a plasma processing apparatus generates plasma by exciting a processing gas, and processes a semiconductor wafer (hereinafter, referred to as a "wafer") by the plasma. Further, in recent years, in order to realize high productivity of a product wafer, a batch type plasma processing apparatus has been proposed, which simultaneously processes a plurality of wafers, for example, as described as in Japanese Patent Laid-Open Publication No. 2019-102680.

In the batch type plasma processing apparatus, the inside of a chamber is comparted into a plurality of processing spaces, and a wafer supported by a wafer support is processed in each processing space. In this case, the present inventors have diligently studied and found that the plasma processing on a plurality of wafers may become non-uniform.

In a technology according to the present disclosure, a batch type plasma processing apparatus performs a uniform plasma processing on a plurality of substrates. In the following, descriptions will be made on a plasma processing apparatus according to an embodiment with reference to the drawings. In the present specification and drawings, components having substantially the same functional configurations will be denoted by the same symbols, and the descriptions thereof will be omitted.

[Plasma Processing Apparatus]

Figure 1:
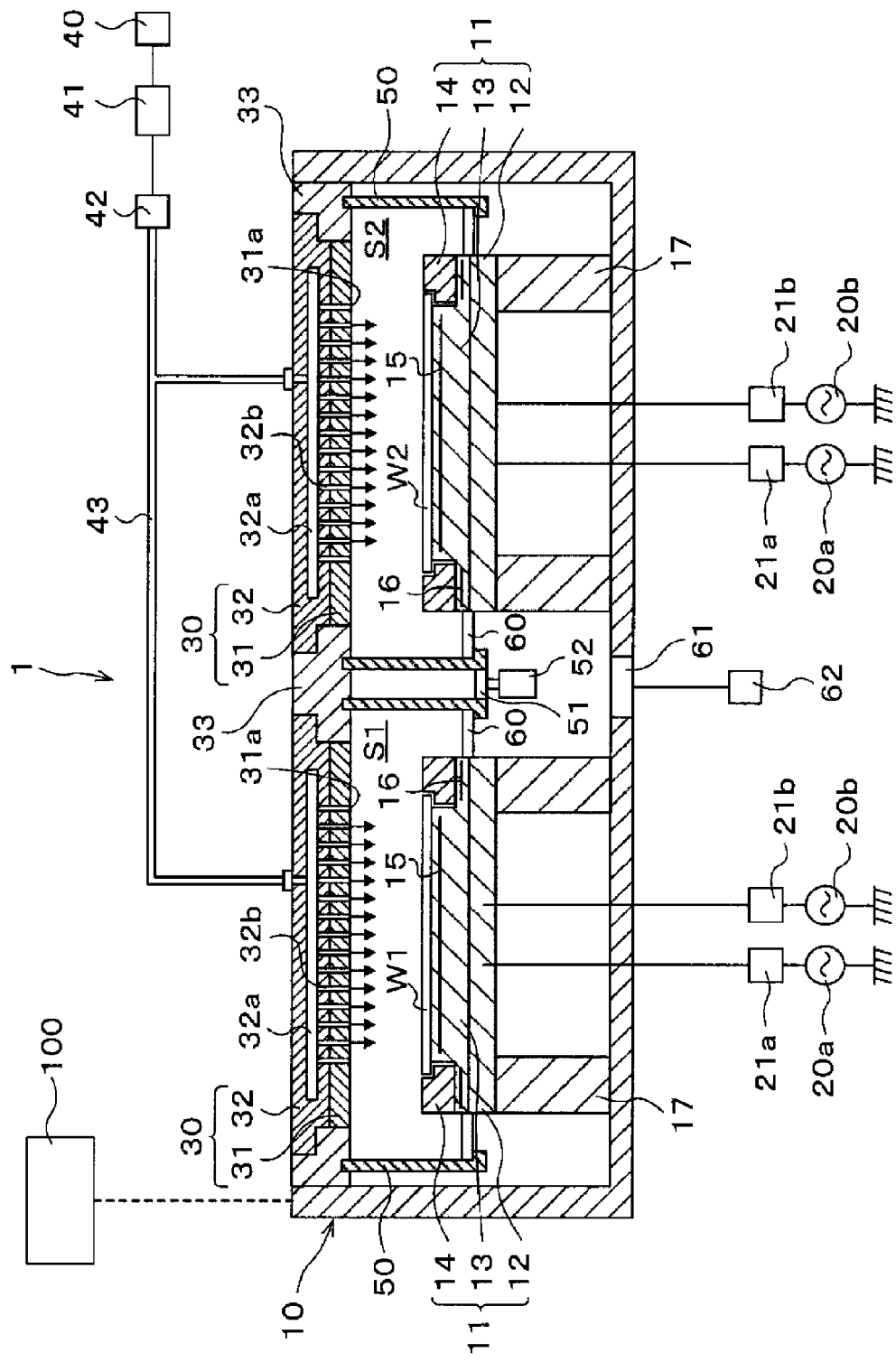
FIG. 1 is a vertical-sectional view illustrating a schematic configuration of a plasma processing apparatus.

First, the plasma processing apparatus according to the embodiment will be described. FIG. 1 is a vertical-sectional view illustrating a schematic configuration of a plasma processing apparatus 1. In the plasma processing apparatus 1 of the embodiment, a plasma processing is performed on a plurality of wafers W, for example, two substrates at the same time. The plasma processing is not particularly limited, and for example, an etching processing or a film forming processing is performed.

The plasma processing apparatus 1 includes a chamber 10. The chamber 10 is made of, for example, aluminum, and the surface of the chamber is anodized. The plasma processing apparatus 1 of the embodiment simultaneously processes two wafers W as described above. Then, two processing spaces S in which each of two wafers W is accommodated and processed, respectively, are defined inside the chamber 10. In the following description, the two wafers W may be referred to as wafers W1 and W2, and the two processing spaces S may be referred to as processing spaces S1 and S2.

A wafer support 11 serving as a substrate support that supports the wafer W is accommodated inside the chamber 10. Two wafer supports 11 are provided for each of the processing spaces S1 and S2. Each wafer support 11 includes a lower electrode 12, an electrostatic chuck 13, and an edge ring 14. Further, although not illustrated, the wafer support 11 may include a temperature adjusting module configured to adjust at least one of the electrostatic chuck 13 and the wafer W to a target temperature. The temperature adjusting module may include a heater, a flow path, or a combination thereof. A temperature adjusting fluid such as a coolant or a heat transfer gas flows through the flow path.

The electrostatic chuck 13 is a member configured to adsorb and hold both the wafer W and the edge ring 14 by electrostatic force, and is provided on the lower electrode 12. The electrostatic chuck 13 has an upper surface of the central portion higher than an upper surface of the peripheral portion. The upper surface of the central portion of the electrostatic chuck 13 serves a wafer placing surface on which the wafer W is placed, and the upper surface of the peripheral portion of the electrostatic chuck 13 serves an edge ring placing surface on which the edge ring 14 is placed.

The edge ring 14 is an annular member disposed to surround the wafer W placed on the upper surface of the central portion of the electrostatic chuck 13. The edge ring 14 is made of a material appropriately selected depending on the plasma processing, and may be made of, for example, Si or SiC.

An electrode 15 configured to adsorb and hold the wafer W may be provided in the central portion of the electrostatic chuck 13, and an electrode 16 configured to adsorb and hold the edge ring 14 may be provided in the peripheral portion of the electrostatic chuck 13. The electrostatic chuck 13 has a configuration in which the electrodes 15 and 16 are embedded in an insulating member including an insulating material.

A DC voltage is applied to the electrode 15 from a DC power source (not illustrated). By the electrostatic force generated by this, the wafer W is adsorbed and held on the upper surface of the central portion of the electrostatic chuck 13. Similar to this, a DC voltage is applied to the electrode 16 from a DC power source (not illustrated). By the electrostatic force generated by this, the edge ring 14 is adsorbed and held on the upper surface of the peripheral portion of the electrostatic chuck 13.

In the embodiment, the central portion of the electrostatic chuck 13 provided with the electrode 15 and the peripheral portion provided with the electrode 16 are integrally formed, but the central portion and the peripheral portion may be separate portions.

Further, the central portion of the electrostatic chuck 13 is formed to have a diameter, for example, smaller than the diameter of the wafer W, and when the wafer W is placed on the upper surface of the electrostatic chuck 13, the peripheral portion of the wafer W extends from the central portion of the electrostatic chuck 13.

The edge ring 14 has a stepped portion on its upper portion, and the upper surface of the outer peripheral portion is formed to be higher than the upper surface of the inner peripheral portion. The inner peripheral portion of the edge ring 14 is formed to extend under the peripheral portion of the wafer W extending from the central portion of the electrostatic chuck 13. That is, the edge ring 14 is formed to have an inner diameter smaller than the outer diameter of the wafer W.

The lower electrode 12 is made of a conductive metal, for example, aluminum. The temperature adjusting module described above may be provided in the lower electrode 12.

The lower electrode 12 is connected to a first radio-frequency (RF) power source 20a and a second RF power source 20b via a first matcher 21a and a second matcher 21b, respectively, and is configured to supply a radio-frequency power to the wafer support 11.

The first radio-frequency power source 20a is a power source that generates a radio-frequency power for plasma generation. A radio-frequency power, which has a frequency of 27 MHz to 100 MHz, for example, 40 MHz, is supplied to the lower electrode 12 from the first RF power source 20a. The first matcher 21a includes a circuit configured to match an output impedance of the first RF power source 20a and an input impedance of a load side (the lower electrode 12 side).

The second RF power source 20b generates a radio-frequency power (a radio-frequency bias power) for drawing ions into the wafer W, and supplies the radio-frequency bias power to the lower electrode 12. The frequency of the radio-frequency bias power may be within a range of 200 kHz to 13.56 MHz, for example, 3 MHz. The second matcher 21b includes a circuit configured to match an output impedance of the second RF power source 20b and an input impedance of a load side (the lower electrode 12 side). A direct current (DC) pulse generating unit may be used instead of the second RF power source 20b.

In the embodiment, the first RF power source 20a, the second RF power source 20b, the first matcher 21a, and the second matcher 21b are provided corresponding to each wafer support 11 in the processing spaces S1 and S2, respectively. In this case, supply and stop timings of the radio-frequency power to the wafer support 11 in the processing space S1 and supply and stop timings of the radio-frequency power to the wafer support 11 in the processing space S2 may be individually controlled. As a result, the supply and the stop timings of the radio-frequency power may be arbitrarily adjusted according to the individual difference of the wafer supports 11.

The two wafer supports 11 configured as described above are fastened to a substantially cylindrical support member 17 provided on the bottom of the chamber 10, respectively. The support member 17 is made of, for example, an insulator such as ceramic.

A shower head 30 is provided above each of the two wafer supports 11 to face the wafer support 11. The shower head 30 includes an electrode plate 31 disposed to face the processing spaces S1 and S2, and an electrode support body 32 provided above the electrode plate 31. The electrode plate 31 functions as a pair of an upper electrode together with the lower electrode 12. The shower head 30 is supported at the top (ceiling surface) of the chamber 10 via a support member 33.

A plurality of gas ejection ports 31a is formed in the electrode plate 31 to supply the processing gas sent from a gas diffusion chamber 32a (to be described later) to the processing space S. The electrode plate 31 is made of, for example, a conductor or a semiconductor having a low electrical resistivity.

The electrode support body 32 detachably supports the electrode plate 31, and is made of a conductive material such as, for example, aluminum with the surface anodized. A gas diffusion chamber 32a is formed inside the electrode support body 32. A plurality of gas flowing holes 32b in communication with the gas ejection port 31a from the gas diffusion chamber 32a is formed.

Further, the electrode support body 32 is connected to a gas supply source group 40, which supplies the processing gas to the gas diffusion chamber 32a, via a flow rate control device group 41, a valve group 42, and a gas supply pipe 43. The gas supply source group 40, the flow rate control device group 41, the valve group 42, and the gas supply pipe 43 are commonly provided for the processing spaces S1 and S2.

The gas supply source group 40 includes a plurality of types of gas supply sources necessary for the plasma processing. In the plasma processing apparatus 1, the processing gas from one or more gas supply sources selected from the gas supply source group 40 is supplied to the gas diffusion chamber 32a via the flow rate control device group 41, the valve group 42, and the gas supply pipe 43. Then, the processing gas supplied to the gas diffusion chamber 32a is dispersed and supplied in a shower shape into the processing spaces S1 and S2 via the gas flow holes 32b and the gas ejection ports 31a.

Further, the plasma processing apparatus 1 is provided with deposit shields 50 along the inner wall of the chamber 10, with respect to each of the processing spaces S1 and S2. Each deposit shield 50 serves to suppress reaction products (deposits) from being attached to the inner wall of the chamber 10, and is configured by coating an aluminum material with a ceramics such as $Y_2O_3$.

The deposit shield 50 is provided corresponding to the wafer support 11, and defines the processing spaces S1 and S2. Two deposit shields 50 are connected by a stay 51 serving as a connecting member. A movable unit 52 is provided below the stay 51. The movable unit 52 commonly operates the two deposit shields 50 via the stay 51 and in the embodiment, moves the deposit shield 50 up and down. The details of the configurations of the deposit shield 50, the stay 51, and the movable unit 52 will be described later.

Then, by lowering the deposit shield 50 by the movable unit 52, the wafer W is carried in and placed on the wafer support 11. Further, by raising the deposit shield 50 by the movable unit 52 and bringing the deposit shield 50 into contact with the support member 33, the processing spaces S1 and S2 are formed. In other words, the deposit shield 50 also achieves a function of a shutter for carrying in/out the wafer W to/from the processing spaces S1 and S2.

A baffle plate 60 is provided between the wafer supports 11 and the deposit shields 50, respectively. The baffle plate 60 includes a plurality of through holes for exhausting the inside of the processing spaces S1 and S2. Further, the baffle plate 60 is configured by, for example, coating an aluminum member with ceramics such as $Y_2O_3$. The processing spaces S1 and S2 are communicated with an exhaust port 61 commonly formed with respect to the processing spaces S1 and S2 via the baffle plate 60. The exhaust port 61 is connected to, for example, an exhaust device 62 such as a vacuum pump, and is configured to reduce the pressure inside the processing spaces S1 and S2 by the exhaust device 62, respectively. The exhaust port 61 and the exhaust device 62 may be individually provided with respect to the processing spaces S1 and S2.

The above plasma processing apparatus is provided with a controller 100. The controller 100 is, for example, a computer including a CPU or a memory, and includes a program storage unit (not illustrated). A program that controls the plasma processing in the plasma processing apparatus 1 is stored in the program storage unit. The program may be recorded in a computer-readable recording medium, and installed from the recording medium to the controller 100.

[Method for Plasma Processing]

Next, descriptions will be made on an example of the plasma processing that is performed by the plasma processing apparatus 1 configured as described above. The plasma processing apparatus 1 performs processings, for example, an etching processing, a film forming processing, and a diffusing processing on two wafers W.

First, in a state where the deposit shield 50 is lowered, two wafers W1 and W2 are carried into the inside of the chamber 10, and the wafers W1 and W2 are placed on each wafer support 11. Thereafter, the deposit shield 50 is raised, and the processing spaces S1 and S2 are defined. Further, a DC voltage is applied to the electrode 15 of the electrostatic chuck 13, and thus, the wafers W1 and W2 are electrostatically adsorbed and held on the electrostatic chuck 13 by electrostatic force. Further, after the wafers W1 and W2 are carried in, the pressure inside the chamber 10 is reduced to a predetermined vacuum degree.

Next, the processing gas is supplied to each of the processing spaces S1 and S2 from the gas supply source group 40 via the shower head 30. Further, a radio-frequency HF for plasma generation is supplied to the lower electrode 12 from the first RF power source 20a, and thus, the processing gas is excited to generate plasma. At this time, a radio-frequency LF for ion drawing may be supplied from the second RF power source 20b. Then, the plasma processing is performed on the wafers W1 and W2 by the action of the generated plasma in each of the processing spaces S1 and S2.

When the plasma processing is ended, the supply of the radio-frequency power HF from the first RF power source 20a and the supply of the processing gas from the gas supply source group 40 are stopped. When the radio-frequency power LF is supplied during the plasma processing, the supply of the radio-frequency power LF is also stopped. Subsequently, the adsorption and holding of the wafers W1 and W2 by the electrostatic chuck 13 is stopped.

Thereafter, the deposit shield 50 is lowered, and the wafers W1 and W2 are carried out from the chamber 10. In this manner, a series of plasma processing is ended.

[Deposit Shield]

Next, the configurations of the deposit shield 50, the stay 51, and the movable unit 52 described above will be described. In the embodiment, the deposit shield 50, the stay 51, and the movable unit 52 are configured such that the plasma processing on the wafers W1 and W2 becomes uniform in each of the processing spaces S1 and S2.

Therefore, the present inventors first diligently studied the reason for the non-uniform plasma processing on the wafers W1 and W2.

As described above, when a light emitting monitor (not illustrated) provided in the plasma processing apparatus 1 is monitored during the plasma processing, the light emission intensity is fluctuated. The present inventors investigated and found that a Vpp (volt peak to peak: difference between the maximum voltage and the minimum voltage of an AC voltage) of the radio-frequency power LF fluctuates at the same frequency as the light emission intensity. Further, it is presumed that the radio-frequency power HF also fluctuates with the light emission intensity in the same way. Therefore, it is found that the reason for the non-uniform plasma processing on the wafers W1 and W2 is the radio-frequency power.

Further, according to investigation by the present inventors, when the radio-frequency power LF is supplied to the lower electrode 12 in any one of the processing spaces S1 and S2, the Vpp of the radio-frequency power LF does not fluctuate. Meanwhile, when the radio-frequency power LF is supplied to the lower electrode 12 in both of the processing spaces S1 and S2, the Vpp of the radio-frequency power LF fluctuates. From this, it is found that the radio-frequency power interferes between the processing spaces S1 and S2.

Therefore, the present inventors diligently studied the reason for the interference of the radio-frequency power, and found that the reasons are the following (a) to (c).

Figure 2:
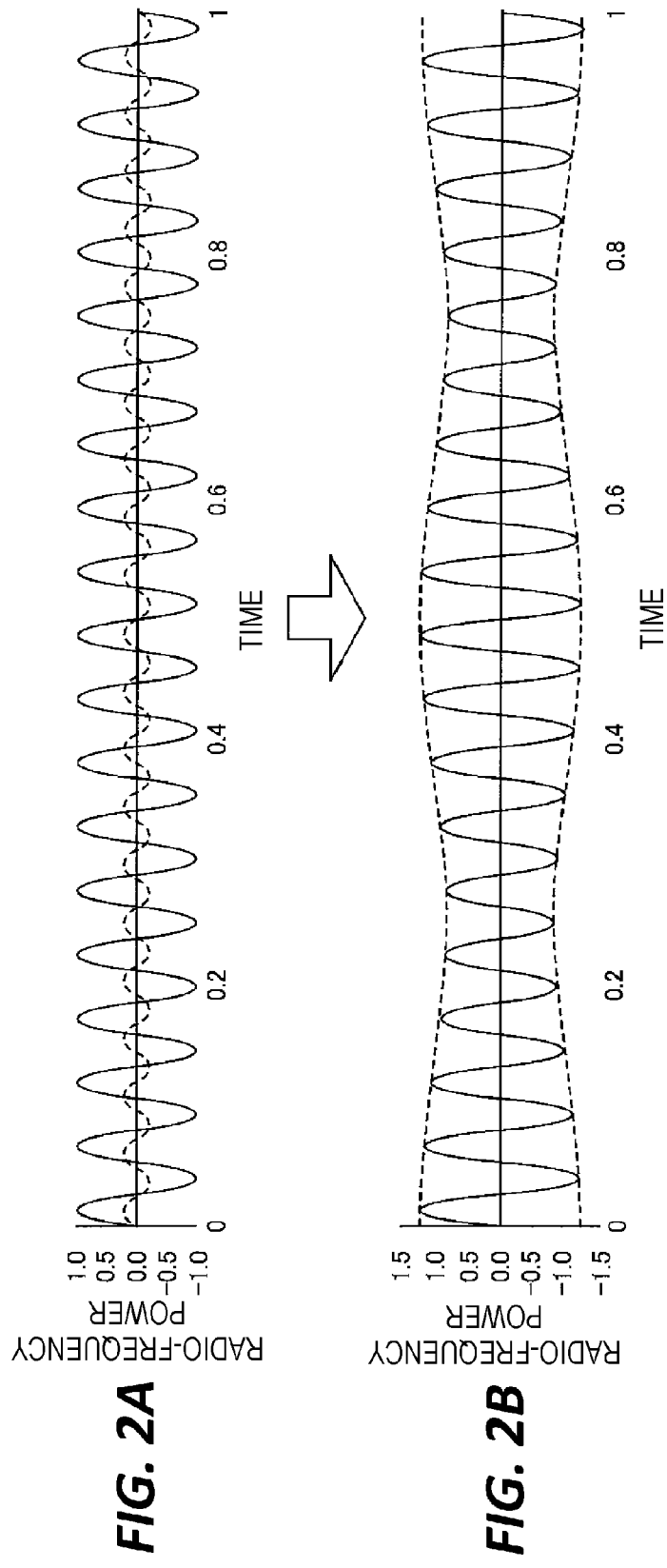
FIGS. 2A and 2B are explanatory views illustrating a state where radio-frequency powers having a frequency shift are combined.

(a) The radio-frequency power from the first RF power source 20a (second RF power source 20b) corresponding to the processing space S1 and the radio-frequency power from the first RF power source 20a (second RF power source 20b) corresponding to the processing space S2 are compared with each other using an oscilloscope. As a result, as illustrated in FIG. 2A, it is found that the radio-frequency powers have a frequency shift. In FIGS. 2A and 2B, the vertical axis represents radio-frequency power, and the horizontal axis represents time. Further, in FIG. 2A, the solid line represents the radio-frequency power to the processing space S1, and the dotted line represents the radio-frequency power to the processing space S2. Then, as illustrated in FIG. 2B, when these two radio-frequency powers are combined, the amplitude increases or decreases at a frequency different from the original frequency, and the Vpp fluctuates.

(b) The two deposit shields 50 are electrically connected to each other via the stay 51. As a result, a current flows between the two deposit shields 50.

(c) In the plasma processing apparatus 1, a current flows in a current return circuit, that is, a circuit in which the ceiling plate (support member 33) of the chamber 10, the deposit shield 50, the baffle plate 60, and the ground of the matcher are connected in the order. However, when a contact failure occurs between the deposit shield 50 and the support member 33, or between the deposit shield 50 and the baffle plate 60, the current does not flow properly. Further, when the contact failure occurs as described above, plasma is leaked to the outside of the deposit shield 50.

Due to the above reasons (a) to (c), radio-frequency power having a shifted frequency enters from the processing space S2 through the deposit shield 50 in the processing space S1. That is, a radio-frequency interferes in the processing space S1.

From the above findings, in the embodiment, as a countermeasure of above (b), the deposit shields 50 are insulated from each other. Further, as a countermeasure of above (c), the contact between the deposit shield 50 and the support member 33, and between the deposit shield 50 and the baffle plate 60 is improved.

First, descriptions will be made on the countermeasure for insulating the deposit shields 50 from each other. That is, it is a countermeasure to form a path for a radio-frequency current that does not interfere with each other between the deposit shields 50, and in this case, the radio-frequency current is suppressed from flowing between the deposit shields 50.

Figure 3:
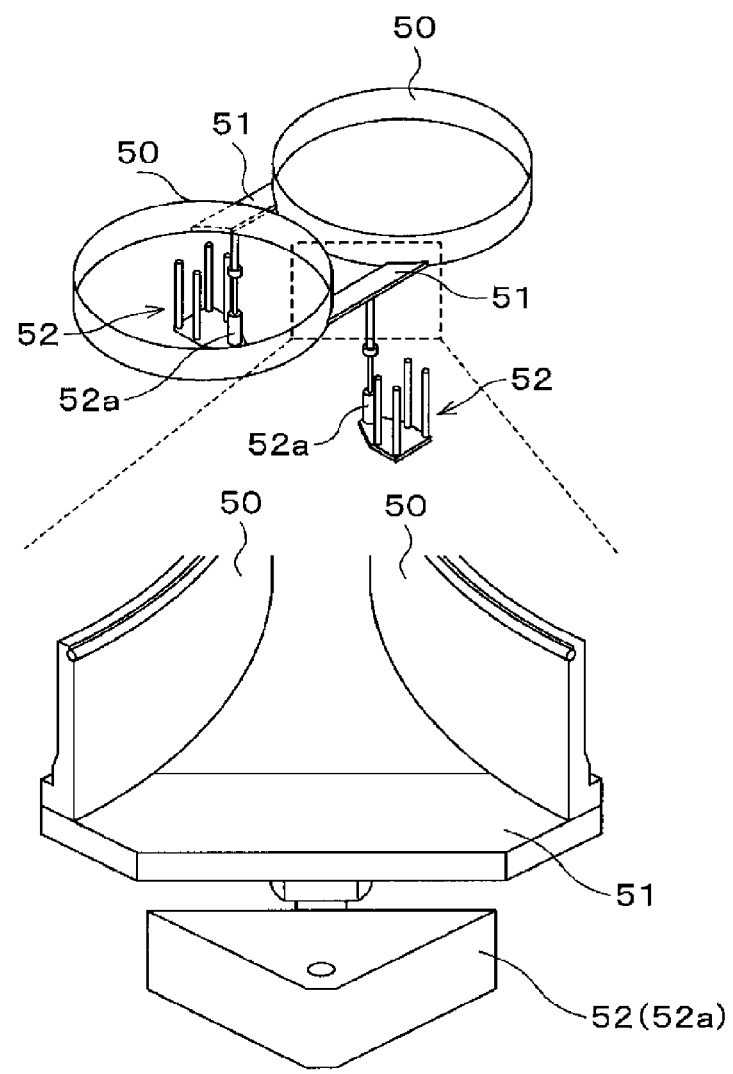
FIG. 3 is an explanatory view illustrating a schematic configuration of a deposit shield, a stay, and a movable unit.

As illustrated in FIG. 3, two deposit shields 50 have a substantially cylindrical shape, respectively. As described above, the deposit shield 50 is configured by, for example, coating an aluminum member with ceramics such as $Y_2O_3$.

Two deposit shields 50 are connected by two stays 51. The stay 51 is configured by, for example, coating an aluminum member with $Al_2O_3$. It may be considered to make the stay 50 itself from an insulating material in order to insulate the deposit shields 50 from each other. However, in this case, the strength of the stay 51 becomes low and it is difficult to support the two deposit shields 50. Therefore, aluminum having a desired strength is used as a base material of the stay 51 in the embodiment.

Below the stay 51, two movable units 52 are provided for each stay 51. The movable unit 52 includes an actuator 52a, and commonly moves the two deposit shields 50 up and down via the stay 51. That is, the two movable units 52 are synchronized to commonly move the two deposit shields 50 up and down. In the illustrated example, two movable units 52 are provided corresponding to each stay 51, but the number or the arrangement of the movable units 52 is not limited thereto.

Figure 4A:
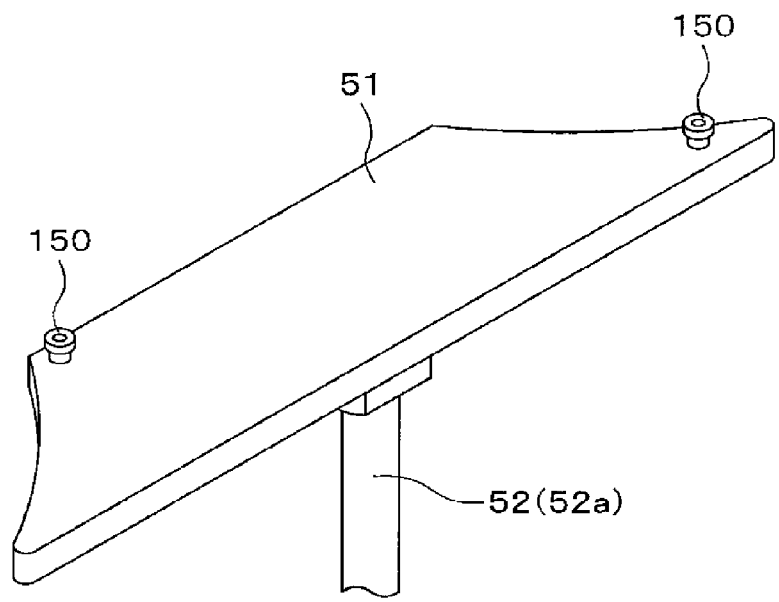
FIGS. 4A and 4B are explanatory views illustrating the schematic configuration of the stay.
Figure 4B:
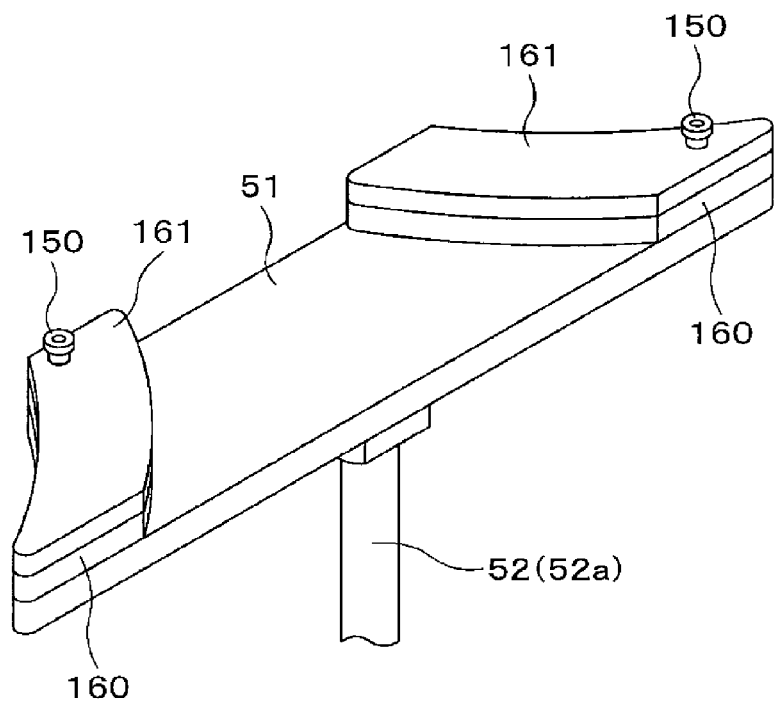

FIG. 4A illustrates a reference example, and FIG. 4B illustrates the embodiment. As illustrated in FIG. 4A, for example, the stay 51 is positioned and fixed to the deposit shield 50 by a positioning member 150, which is a projection member. For example, aluminum is used for the positioning member 150. Then, the two deposit shields 50 are electrically connected to each other, and as a result, radio-frequency power is propagated between the wafer support 11 in the processing space S1 and the wafer support 11 in the processing space S2, and interference of the radio-frequency power occurs.

Therefore, as illustrated in FIG. 4B, an insulating portion 160 is provided on the upper surface of the stay 51, and a conductive portion 161 is provided on the upper surface of the insulating portion 160. The insulating portion 160 is made of, for example, quartz. Further, the conductive portion 161 has the same configuration as the deposit shield 50, that is, is configured by, for example, coating an aluminum member with ceramics such as $Y_2O_3$. In this case, the two deposit shields 50 are insulated from each other by the insulating portion 160. As a result, the interference of the radio-frequency power described above may be suppressed. When the strength of the insulating portion 160 on the stay 51 is ensured, the conductive portion 161 may be omitted. Further, the conductive portion 161 does not have to be a conductor, and an insulating material may be used.

Figure 5A:
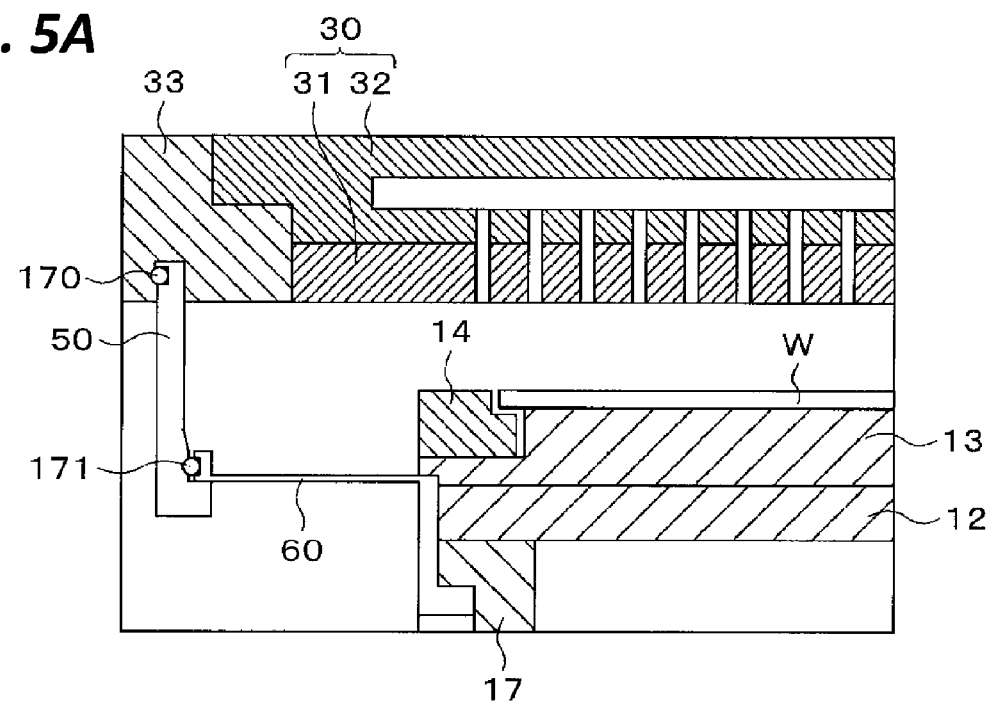
FIGS. 5A and 5B are explanatory views illustrating a schematic configuration of a shield member with respect to the deposit shield.

Next, descriptions will be made on a countermeasure for improving the contact between the deposit shield 50 and the support member 33, and between the deposit shield 50 and the baffle plate 60. FIG. 5A illustrates a reference example, and FIG. 5B illustrates the embodiment.

As illustrated in FIG. 5A, for example, the upper portion of the deposit shield 50 in the related art comes into contact with the support member 33 at the side surface via a sealing member 170. The sealing member 170 is made of a conductive material. In this case, the sliding resistance between the deposit shield 50 and the sealing member 170 increases according to a change-with-time, and the deposit shield 50 may not be raised to an appropriate contact position. That is, as illustrated in FIG. 6A, when the deposit shield 50 is raised to an appropriate position, a good contact may be secured between the deposit shield 50 and the support member 33. However, as illustrated in FIG. 6B, when the deposit shield 50 is not raised sufficiently due to the sliding resistance, the contact between the deposit shield 50 and the support member 33 becomes poor. That is, the deposit shield 50 and the support member 33 are not in contact with each other in the circumferential direction.

Further, as illustrated in FIG. 5A, for example, the lower portion of the deposit shield 50 in the related art comes into contact with the baffle plate 60 at the side surface via a sealing member 171. Then, as illustrated in FIG. 6B, when the deposit shield 50 is not raised sufficiently due to the sliding resistance, the contact between the deposit shield 50 and the baffle plate 60 becomes poor. That is, the deposit shield 50 and the baffle plate 60 are not in contact with each other in the circumferential direction.

Figure 5B:
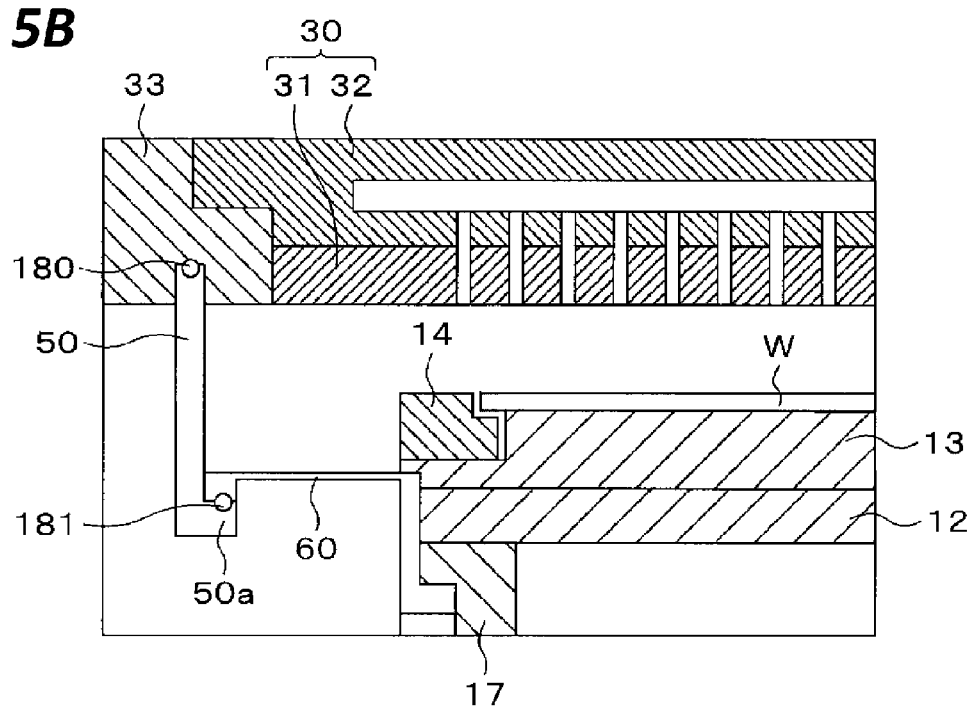
Figure 7:
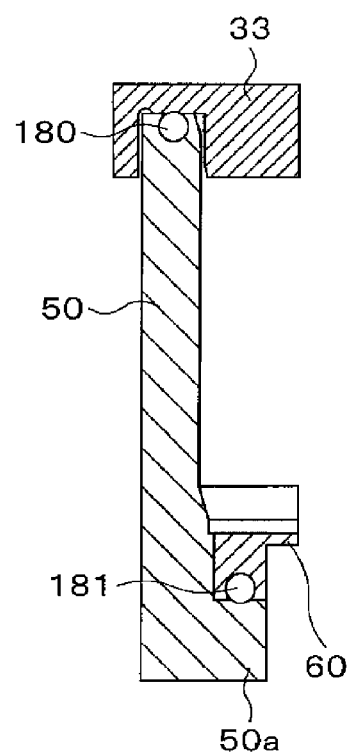
FIG. 7 is an explanatory view illustrating a sealing state of a deposit shield of an embodiment.

Therefore, as illustrated in FIG. 5B and FIG. 7, in the upper portion of the deposit shield 50, a sealing member 180 is provided between the upper surface of the deposit shield 50 and the lower surface of the support member 33. The sealing member 180 is made of a conductive material. In this case, when the deposit shield 50 is raised, the sliding resistance as illustrated in FIG. 5A is low. Then, the raising of the deposit shield 50 is stopped at the position where the sealing member 180 comes into contact with the contact surface, and the deposit shield 50 is not physically raised any further. As a result, the deposit shield 50 and the support member 33 may be brought into contact with each other via the sealing member 180.

Further, a protrusion 50a protruding toward the baffle plate 60 is formed in the lower portion of the deposit shield 50. A sealing member 181 is provided between the upper surface of the protrusion 50a and the lower surface of the baffle plate 60. The sealing member 181 is also made of a conductive material. In this case, when the deposit shield 50 is raised, the raising of the deposit shield 50 is stopped at the position where the sealing member 181 comes into contact with the contact surface. As a result, the deposit shield 50 and the baffle plate 60 may be brought into contact with each other via the sealing member 181.

As described above, in the embodiment, the contact between the deposit shield 50 and the support member 33, and between the deposit shield 50 and the baffle plate 60 may be improved. As a result, in the current return circuit, which is the return circuit in which the support member 33, the deposit shield 50, the baffle plate 60, and the ground of the matcher are connected in the order, a current may appropriately flow, and the interference of the radio-frequency power may be suppressed. Further, the sealing property is improved by improving the contact, the leakage of plasma to the outside of the deposit shield 50 may be suppressed.

According to the above embodiment, the two deposit shields 50 are commonly moved up and down by the movable unit 52, and thus, the device cost may be reduced. Further, since the number of the movable units 52 may be reduced, it is possible to make the space for providing the movable units 52 small.

Further, according to the embodiment, since the two deposit shields 50 are insulated from each other by the insulating portion 160, a current does not flow between the two deposit shields 50. As a result, the interference of the radio-frequency power may be suppressed. Therefore, blinking of plasma may be suppressed.

Further, according to the embodiment, the sealing member 180 is provided between the deposit shield 50 and the support member 33, and the sealing member 181 is provided between the deposit shield 50 and the baffle plate 60, and thus, the contacts may be improved. As a result, in the current return circuit, which is the return circuit in which the support member 33, the deposit shield 50, the baffle plate 60, and the ground of the matcher are connected in the order, a current may appropriately flow, and the interference of the radio-frequency power may be suppressed. Further, the sealing property is improved by improving the contact, it is also possible to suppress the leakage of plasma to the outside of the deposit shield 50.

By taking the above countermeasures of the embodiment, etching rates for the wafers W1 and W2 may become substantially the same in each of the processing spaces S1 and S2. Further, in each of the processing spaces S1 and S2, the distribution of the etching rates on the wafers W1 and W2 may become concentric. In other words, in each of the processing spaces S1 and S2, a uniform plasma processing may be performed on the wafers W1 and W2.

Next, descriptions will be made on the effect of the above described embodiment using experimental results by the present inventors.

In the embodiment, the plasma processing apparatus 1 in the case illustrated in FIG. 4B and FIG. 5B is used. That is, as illustrated in FIG. 4B, the insulating portion 160 and the conductive portion 161 are provided on the upper surface of the stay 51. Further, as illustrated in FIG. 5B, the sealing member 180 is provided between the upper surface of the deposit shield 50 and the lower surface of the support member 33, and the sealing member 181 is provided between the upper surface of the protrusion 50a and the lower surface of the baffle plate 60.

As a reference example, the plasma processing apparatus 1 in the case illustrated in FIG. 4A and FIG. 5A is used. That is, as illustrated in FIG. 4A, the insulating portion 160 and the conductive portion 161 are not provided on the upper surface of the stay 51. Further, as illustrated in FIG. 5A, the sealing member 170 is provided between the side surface of the deposit shield 50 and the side surface of the support member 33, and the sealing member 171 is provided between the side surface of the protrusion 50a and the side surface of the baffle plate 60.

Then, in both the embodiment and the reference example, sputtering is performed using argon gas under the following conditions. The target wafer W is a wafer on which an oxide film (e.g., $SiO_2$) is formed. The pressure of the inside of each of the processing spaces S1 and S2 is 60 mTorr, and the flow rate of the argon gas supplied to each of the processing spaces S1 and S2 is 600 sccm. The radio-frequency power of 100 MHz frequency supplied from the first RF power source 20a is 500 W, and the radio-frequency of 13 MHz frequency supplied from the second RF power source 20b is 1500 W. The pressure of helium gas serving as a heat transfer gas is 15 Torr in both the central portion and the peripheral portion of the wafer W. The sputtering is performed for three minutes.

Figure 8A:
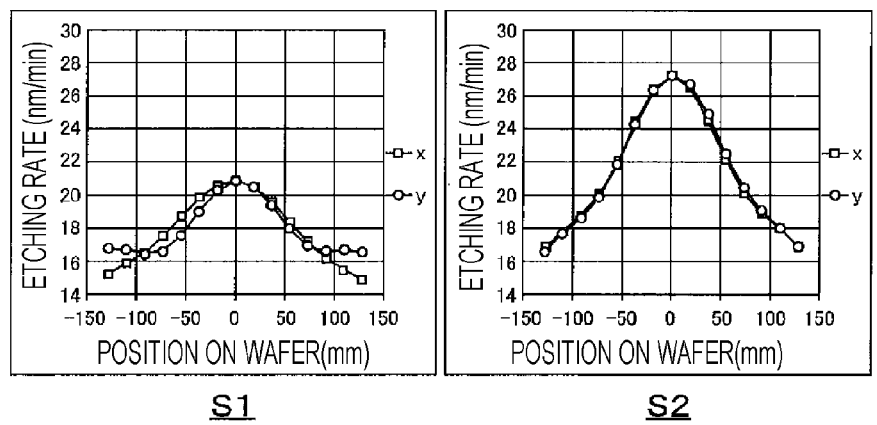
FIGS. 8A and 8B are graphs illustrating experimental results of an etching rate on a wafer.
Figure 8B:
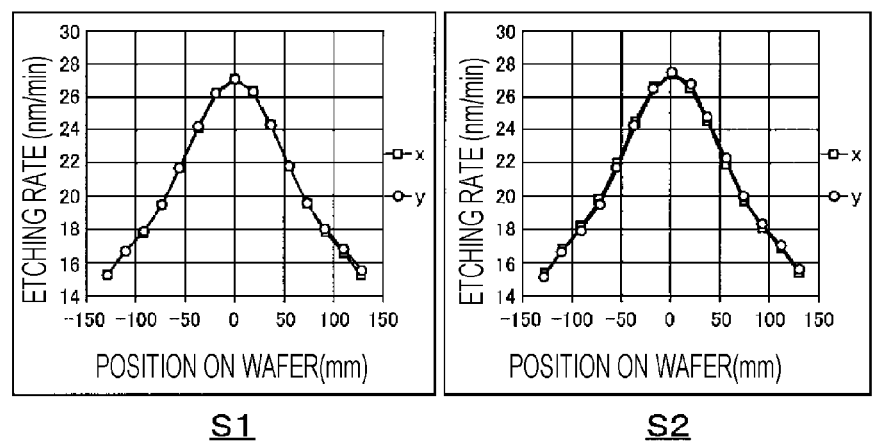

The results obtained by performing experiments are illustrated in FIGS. 8A and 8B, and FIGS. 9A and 9B. FIG. 8A and FIG. 9A illustrate the experimental results of the reference example, and FIG. 8B and FIG. 9B illustrate the experimental results of the embodiment.

In FIGS. 8A and 8B, the horizontal axis represents a radial position where the center of the wafer W is 0 (zero), and the vertical axis represents the etching rate. In the reference example in FIG. 8A, the etching rates in the processing spaces 51 and S2 are different from each other. Meanwhile, in the embodiment in FIG. 8B, the etching rates are substantially the same as each other in the processing spaces 51 and S2. Therefore, in the embodiment, it is found that, in the processing spaces 51 and S2, a uniform plasma processing may be performed on the wafers W1 and W2.

FIGS. 9A and 9B illustrate contour diagrams of the etching rates on the wafers W1 and W2 in the processing spaces 51 and S2. In the reference example in FIG. 9A, the distribution of the etching rate is not concentric in any of the processing spaces 51 and S2. This represents that the etching rate is non-uniform in the circumferential direction. Further, since a reactive gas is not used under the process conditions in the experiment, it is the distribution of the ion flux itself. This is because, since the ground of the deposit shield 50 is non-uniform in the circumferential direction, electron density is not the same in the circumferential direction. Meanwhile, in the embodiment in FIG. 9B, the distribution of the etching rate is substantially concentric in both of the processing spaces S1 and S2. Therefore, from this point of view, in the embodiment, it is found that, in the processing spaces S1 and S2, a uniform plasma processing may be performed on the wafers W1 and W2.

As the experimental results of the embodiment are visually confirmed, there is no blinking of the plasma in each of the processing spaces S1 and S2. Further, there is no plasma leakage in each of the processing spaces S1 and S2.

[Other Embodiment]

In the above embodiment, both the insulating between the deposit shields 50, and the improvement of the contacts between the deposit shield 50 and the support member 33, and between the deposit shield 50 and the baffle plate 60 are performed, but either one of them may be performed.

That is, when the deposit shields 50 are insulated from each other by the insulating portion 160, the interference of the radio-frequency power source may be suppressed, and a uniform plasma processing may be performed on the wafers W1 and W2 in the processing spaces S1 and S2.

Further, by providing the sealing member 180 between the deposit shield 50 and the support member 33, and providing the sealing member 181 between the deposit shield 50 and the baffle plate 60, even if the contacts are improved merely, the interference of the radio-frequency power source may be suppressed, and the leakage of the plasma also may be suppressed. Further, either one of sealing members 180 and 181 may be provided. That is, a combination of the sealing member 180 and the sealing member 171 may be used, or a combination of the sealing member 170 and the sealing member 181 may be used.

In any cases, as compared with the related art, the interference of the radio-frequency power source may be suppressed, and a uniform plasma processing may be performed on the wafers W1 and W2 in the processing spaces S1 and S2. However, the effect is increased when, as in the embodiment, both the insulating between the deposit shields 50, and the improvement of the contacts between the deposit shield 50 and the support member 33, and between the deposit shield 50 and the baffle plate 60 are performed.

Further, in the above embodiment, descriptions have made on the case in which the plasma processing apparatus 1 includes two deposit shields 50 (processing spaces S1 and S2), but the number of the deposit shields 50 is not limited thereto. For example, when the number of the deposit shields 50 is four, the adjacent deposit shields 50 are connected to each other via the stay 51.

Further, in the above embodiment, the first RF power source 20a, the second RF power source 20b, the first matcher 21a, and the second matcher 21b are individually provided for the wafer support 11 in each of the processing spaces S1 and S2, but may be common to the processing spaces S1 and S2. However, when these are individually provided for the processing spaces S1 and S2 as described above, the supply and the stop timings of the radio-frequency power may be arbitrarily adjusted according to the individual difference of the wafer supports 11.

According to the present disclosure, a uniform plasma processing may be performed on a plurality of substrates in the plasma processing apparatus.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
    a chamber configured to accommodate a plurality of substrates;
    a plurality of substrate supports provided inside the chamber and each configured to support a substrate;
    a plurality of radio-frequency power sources provided corresponding to the plurality of substrate supports, and configured to supply radio-frequency power to the plurality of substrate supports, respectively; and
    a plurality of shields configured to compart the inside of the chamber and provided corresponding to the plurality of substrate supports to define a plurality of processing spaces where plasma is generated, the plurality of processing spaces including at least a first processing space and a second processing space, the plurality of shields including at least a first shield associated with the first processing space and a second shield associated with the second processing space,
    wherein first and second radio-frequency current paths are formed for the first and second processing spaces, respectively, so as not to interfere with one another, and
    wherein a connector is connected to both the first shield and the second shield, and the connector includes an insulator.

2. The plasma processing apparatus according to claim 1, wherein the insulator contains quartz.

3. The plasma processing apparatus according to claim 1, wherein the first shield and the second shield each have a cylindrical shape,
    an upper surface of each of the first and second shields and a lower surface of the chamber are brought into contact with each other to form the first and second processing spaces, and
    a seal is provided between the upper surface of each of the first and second shields and the lower surface of the chamber.

4. The plasma processing apparatus according to claim 1, wherein a first baffle plate is provided in the first processing space and a second baffle plate is provided in the second processing space,
    the first and second shields each have a cylindrical shape and each further has a protrusion that protrudes toward the first and second baffle plates, respectively, and an upper surface of each protrusion and a lower surface of each baffle plate are brought into contact with each other, and
    a seal is provided between the upper surface of each protrusion and the lower surface of each baffle plate.

5. The plasma processing apparatus according to claim 1, wherein the connector is connected to one or more actuators to move the connector and thereby move both the first shield and the second shield simultaneously between an open position and a closed position.

6. The plasma processing apparatus according to claim 5, wherein in the open position, the first processing space is in communication with the second processing space.

7. The plasma processing apparatus according claim 5, further including a first baffle plate in the first processing space and a second baffle plate in the second processing space, and
    wherein in the closed position the first shield engages with the first baffle plate and the second shield engages with the second baffle plate, and in the open position the first shield is spaced from the first baffle plate and the second shield is spaced from the second baffle plate.

8. The plasma processing apparatus according to claim 7, further including a top which extends over both the first processing space and the second processing space, and
wherein in the closed position the first shield and the second shield are both engaged with the top and in the open position the first shield and the second shield are both spaced from the top.

9. The plasma processing apparatus according to claim 1, wherein the connector comprises a base which includes aluminum and at least one insulator provided over the base so that the at least one insulator is between the base and the first shield and the at least one insulator is between the base and the second shield.

10. A plasma processing apparatus comprising:
a chamber configured to accommodate a plurality of substrates;
a plurality of substrate supports provided inside the chamber and each configured to support a substrate;
a plurality of radio-frequency power sources provided corresponding to the plurality of substrate supports, and configured to supply radio-frequency power to the plurality of substrate supports, respectively;
a plurality of shields configured to compart the inside of the chamber and provided corresponding to the plurality of substrate supports to define a processing space where plasma is generated; and
a mover configured to operate the plurality of shields in common.

11. The plasma processing apparatus according to claim 10, wherein adjacent shields are connected with each other by a connector, and the mover operates the connector.

12. The plasma processing apparatus according to claim 10, wherein:
the processing space includes a first processing space and a second processing space,
the plurality of shields include a first shield associated with the first processing space and a second shield associated with the second processing space,
a connector extends between the first shield and the second shield, and
the mover is connected to the connector to move the connector and thereby simultaneously move both the first shield and the second shield.

13. The plasma processing apparatus according to claim 12, wherein the connector includes a base at least partially covered by at least one insulator so that the at least one insulator is between the base and the first shield and the at least one insulator is between the base and the second shield.

14. The apparatus according to claim 12, further including:
a first baffle plate in the first processing space and a second baffle plate in the second processing space; and
a top which extends over the first processing space and the second processing space,
wherein the mover moves the connector to simultaneously move the first shield and the second shield between an open position and a closed position,
in the closed position, the first shield is engaged with the first baffle plate, the second shield is engaged with the second baffle plate, and the first and second shields are engaged with the top, and
in the open position, the first and second shields are spaced from the first and second baffle plates, respectively, and the first and second shields are spaced from top.

15. A plasma processing apparatus comprising:
a chamber configured to accommodate a plurality of substrates;
a plurality of substrate supports provided inside the chamber and each configured to support a substrate;
a plurality of radio-frequency power sources provided corresponding to the plurality of substrate supports, and configured to supply radio-frequency power to the plurality of substrate supports, respectively; and
a plurality of shields configured to compart the inside of the chamber and provided corresponding to the plurality of substrate supports to define a processing space where plasma is generated,
wherein a radio-frequency current path is formed between the plurality of shields so as not to interfere with one another,
wherein each shield has a cylindrical shape,
an upper surface of the shield and a lower surface of the chamber are brought into contact with each other to form the processing space, and
a seal is provided between the upper surface of the shield and the lower surface of the chamber.

16. A plasma processing apparatus comprising:
a chamber configured to accommodate a plurality of substrates;
a plurality of substrate supports provided inside the chamber and each configured to support a substrate;
a plurality of radio-frequency power sources provided corresponding to the plurality of substrate supports, and configured to supply radio-frequency power to the plurality of substrate supports, respectively; and
a plurality of shields configured to compart the inside of the chamber and provided corresponding to the plurality of substrate supports to define a processing space where plasma is generated,
wherein a radio-frequency current path is formed between the plurality of shields so as not to interfere with one another,
wherein a baffle plate is provided between a shield and a substrate support,
the shield has a cylindrical shape and further includes a protrusion that protrudes toward the baffle plate, and an upper surface of the protrusion and a lower surface of the baffle plate are brought into contact with each other to form the processing space, and
a seal is provided between the upper surface of the protrusion and the lower surface of the baffle plate.

* * * * *

UNITED STATES PATENT AND TRADEMARK OFFICE
CERTIFICATE OF CORRECTION

PATENT NO. : 11,756,769 B2
APPLICATION NO. : 17/220982
DATED : September 12, 2023
INVENTOR(S) : Tohara et al.

It is certified that error appears in the above-identified patent and that said Letters Patent is hereby corrected as shown below:

On the Title Page

Item (56) Column 2, Line 14 "2021/0296102 A1 9/2021 Nagase" should read as --2021/0296102 A1 9/2021 Nagaseki--.

Signed and Sealed this
Seventeenth Day of October, 2023

Katherine Kelly Vidal
*Director of the United States Patent and Trademark Office*